(12) United States Patent
Ubbesen et al.

(10) Patent No.: US 8,653,891 B2
(45) Date of Patent: Feb. 18, 2014

(54) COLLECTOR BOOST

(71) Applicant: RF Micro Devices, Inc., Greensboro, NC (US)

(72) Inventors: Lars Sandahl Ubbesen, Aalborg (DK); Erik Pedersen, Klarup (DK); Søren Deleuran Laursen, Vestbjerg (DK)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/960,950

(22) Filed: Aug. 7, 2013

(65) Prior Publication Data

US 2013/0314153 A1    Nov. 28, 2013

Related U.S. Application Data

(63) Continuation of application No. 13/360,934, filed on Jan. 30, 2012, now Pat. No. 8,531,240.

(60) Provisional application No. 61/437,320, filed on Jan. 28, 2011.

(51) Int. Cl.
  *H03G 9/00*       (2006.01)
(52) U.S. Cl.
  USPC ............ 330/133; 330/297; 330/127; 330/310
(58) Field of Classification Search
  USPC .................................. 330/133, 297, 127, 310
  See application file for complete search history.

(56) References Cited

U.S. PATENT DOCUMENTS

| | | | |
|---|---|---|---|
| 4,717,889 A | 1/1988 | Engelmann | |
| 5,111,158 A | 5/1992 | Malec et al. | |
| 6,191,653 B1 * | 2/2001 | Camp et al. | 330/129 |
| 6,445,247 B1 * | 9/2002 | Walker | 330/10 |
| 6,850,119 B2 | 2/2005 | Arnott | |
| 7,193,459 B1 * | 3/2007 | Epperson et al. | 330/130 |
| 7,427,897 B2 | 9/2008 | Hau et al. | |
| 7,443,244 B2 | 10/2008 | Hagen | |
| 7,595,694 B2 * | 9/2009 | Takahashi et al. | 330/285 |
| 7,760,027 B2 * | 7/2010 | Murji et al. | 330/298 |
| 8,183,925 B2 * | 5/2012 | Ohta et al. | 330/285 |

OTHER PUBLICATIONS

Notice of Allowance for U.S. Appl. No. 13/360,934, mailed May 9, 2013, 8 pages.

* cited by examiner

*Primary Examiner* — Patricia Nguyen
(74) *Attorney, Agent, or Firm* — Withrow & Terranova, P.L.L.C.

(57) ABSTRACT

Embodiments of power amplification devices are described that include a power amplification circuit, a first voltage regulation circuit, and a second voltage regulation circuit. The voltage regulation circuits are configured to provide regulated voltages to the power amplification circuit. The power amplification device also includes a threshold detection circuit to get better maximum output power performance while preserving power efficiency. The threshold detection circuit is configured to increase a voltage adjustment gain of the first voltage regulation circuit when a regulated voltage level of regulated voltage from the second voltage regulation circuit reaches a threshold voltage level. In this manner, the voltage adjustment gain can be increased when the second voltage regulation circuit is close to or has railed. Increasing the voltage adjustment gain when the second voltage regulation circuit is railing or is close to railing improves the power performance and the power efficiency of the power amplification circuit.

20 Claims, 9 Drawing Sheets

COLLECTOR BOOST

RELATED APPLICATIONS

This application is a continuation of U.S. patent application Ser. No. 13/360,934, filed on Jan. 30, 2012 and entitled "COLLECTOR BOOST," now U.S. Pat. No. 8,531,240, which claims the benefit of U.S. Provisional Patent Application Ser. No. 61/437,320, filed on Jan. 28, 2011, the disclosures of which are hereby incorporated herein by reference in their entireties.

FIELD OF THE DISCLOSURE

This disclosure relates generally to power amplification devices and methods of amplifying a radio frequency (RF) transmission signal.

BACKGROUND

As the number of services provided by wireless mobile communication devices increases dramatically, so does the need for mobile communication devices that can handle the various forms of signal formats required to provide the mobile communication services. For example, devices in cellular telephones may need to adhere to standards such as a Global Systems for Mobile communication (GSM) standard, a Personal Communication Services (PCS) standard, an EDGE standard, and a Digital Cellular System (DCS) standard. The standards all require precise output power control over a large dynamic range in order to prevent channel interference.

The key component common to mobile communication devices is a power amplification device. Before reaching the power amplification device, a radio frequency (RF) transmission signal is too weak for transmission to a cellular base station. Therefore, it is the function of the power amplification device to boost the power of the RF transmission signal. However, the power amplification device needs to amplify the RF transmission signal such that the RF transmission signal complies with a specification known as a "burst mask." The burst mask provides requirements for the mean power of the RF transmission signal transmitted in a particular timeslot. More specifically, the burst mask specifies an allowable ramp-up period, duration, and ramp-down period of the mean power of the RF transmission signal during a timeslot. Each of these timeslots may have different burst mask specifications and the RF transmission signal needs to comply with each of these burst mask specifications to prevent switching spectrum interference in other timeslots.

Figure 1:
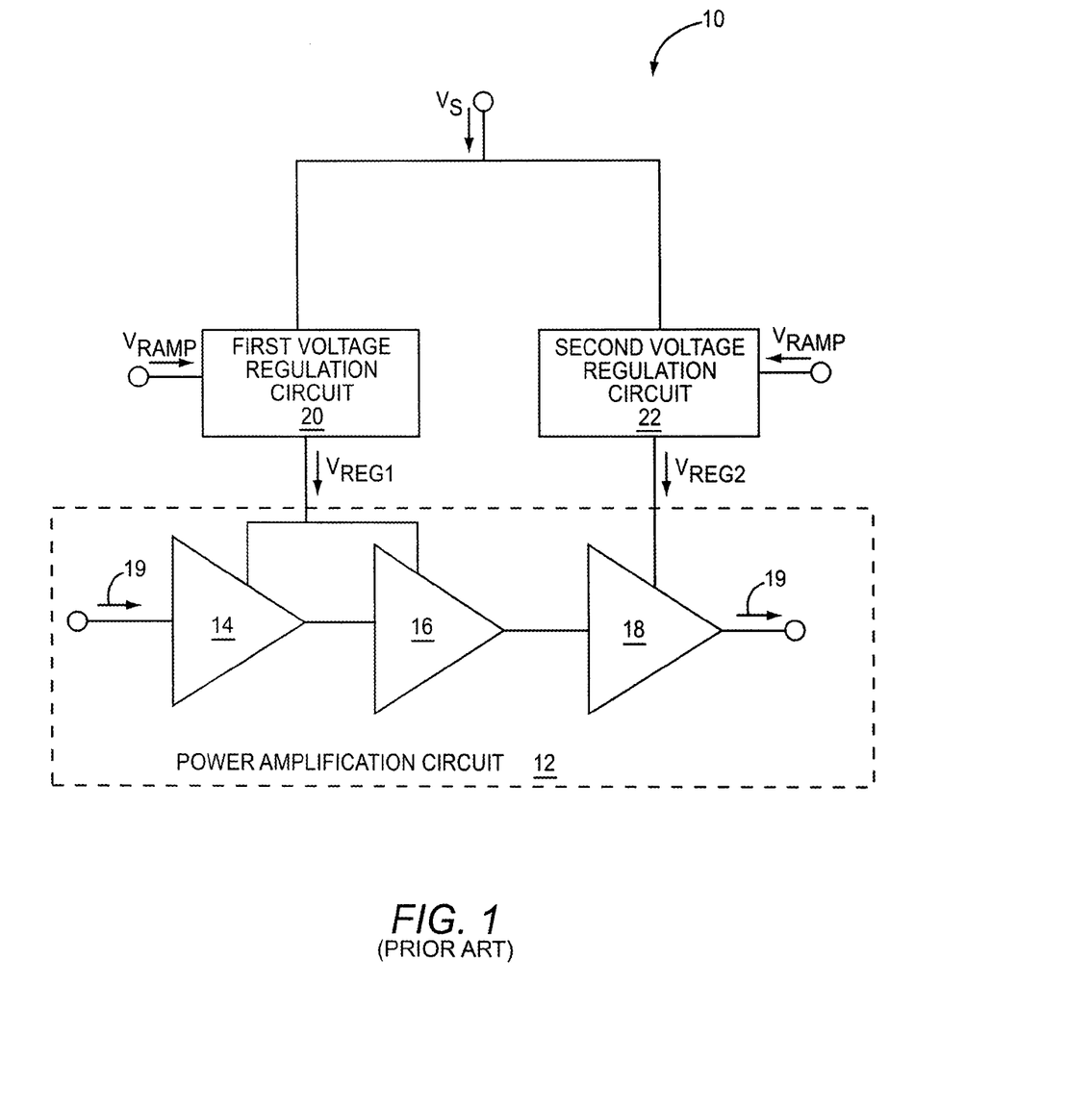
FIG. 1 illustrates a prior art power amplification device that includes a first voltage regulation circuit that provides a first regulated voltage to a driver amplifier stage and a second voltage regulation circuit that provides a second regulated voltage to a final amplifier stage.

FIG. 1 illustrates a prior art power amplification device 10 that includes a power amplification circuit 12. The power amplification circuit 12 includes multiple power amplifier stages, 14, 16, and 18. To provide sufficient power for transmission of the RF transmission signal 19 by an antenna, each power amplifier stage may provide amplification in a cascaded manner according with an amplification gain provided by each power amplifier stage, 14, 16, and 18. Generally, the power amplifier stage 18 is referred to as the final amplifier stage and the amplifier stages 14 and 16 in combination are referred to as a driver amplifier stage.

To meet the burst mask specifications, the amount of power being delivered by the power amplification circuit 10 needs to be appropriately controlled. Thus, a voltage regulation circuit, such as a low-drop-out (LDO) circuit may be utilized to provide a regulated voltage that powers the amplification of the RF transmission signal 19 by the power amplification circuit 12. The driver amplifier stage of the power amplification circuit 12 may designed to provide a maximum output power having a significant margin relative to the rated output power to account for fabrication variations, temperature variations, and/or the like. Nevertheless, if a single voltage regulation circuit is used to provide the same regulated voltage to each of the power amplifier stage, 14, 16, 18, excessive currents are produced in the driver amplifier stage during typical operating conditions which comes at a cost to power efficiency.

Figure 2A:
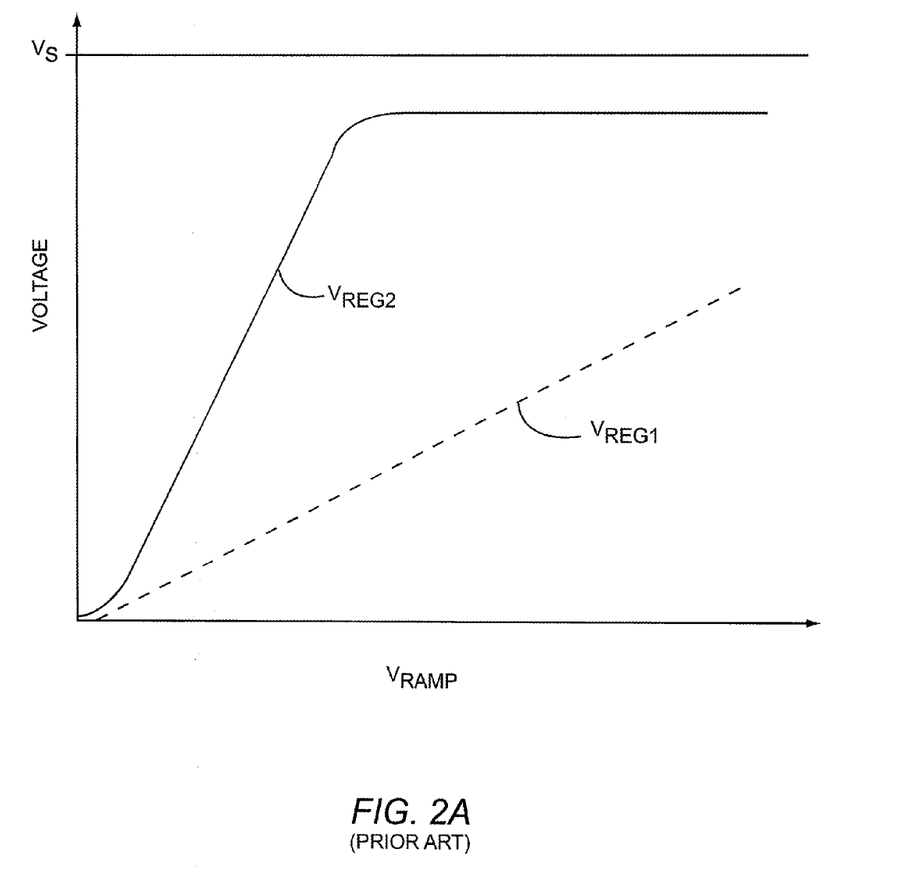
FIG. 2A illustrates a graph of the first regulated voltage and the second regulated voltage provided by the prior art power amplification device of FIG. 1 as a function of a voltage control signal. The graph illustrates the inability of the prior art power amplification device to allow the first regulated voltage to rail thereby resulting in decreased maximum output power.

Referring now to FIGS. 1 and 2A, to improve the power efficiency, the prior art power amplification device 10 uses a first voltage regulation circuit 20, and a second voltage regulation circuit 22. Each of the voltage regulation circuits 20, 22 generates a regulated voltage $V_{REG1}$ and $V_{REG2}$, respectively from a supply voltage $V_S$. To control the regulated voltage levels of the regulated voltages $V_{REG1}$ and $V_{REG2}$ and therefore the amplification gain of the amplifier stages 14, 16, 18, both of the voltage regulation circuits 20, 22 receive a voltage control signal $V_{RAMP}$. A graph of the regulated voltages $V_{REG1}$ and $V_{REG2}$ as a function of a voltage control signal $V_{RAMP}$ is shown in FIG. 2A. In order to reduce current consumption, the voltage adjustment gain of the first voltage regulation circuit 20 needs to be very low. Unfortunately, this results in a reduction of the maximum output power because the regulated voltage level of the regulated voltage $V_{REG1}$ is never allowed to rail near a supply voltage level of the supply voltage, $V_S$.

Figure 2B:
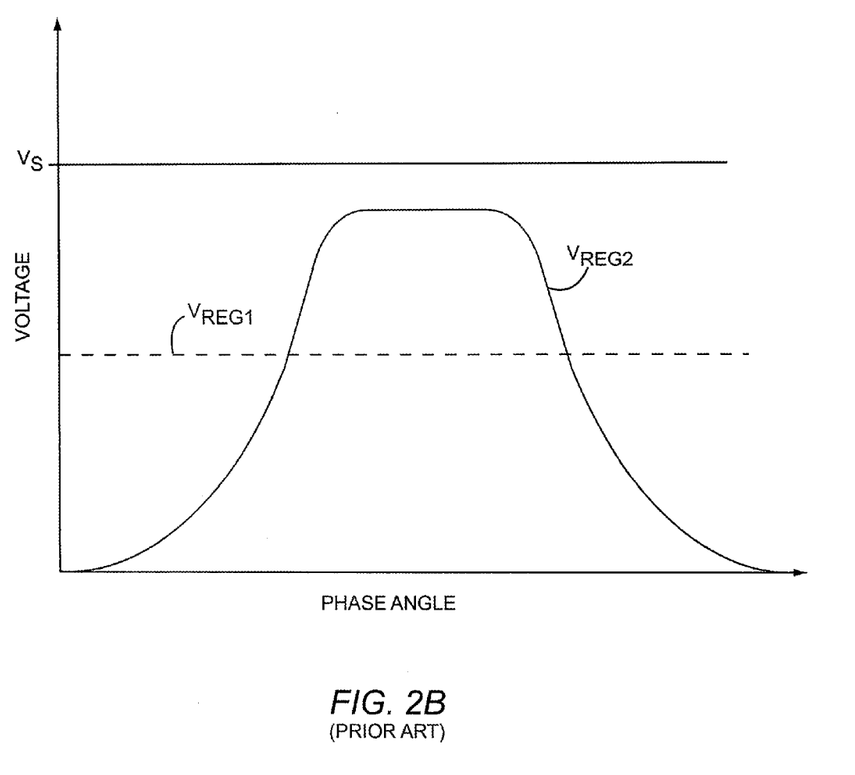
FIG. 2B illustrates a graph of the first regulated voltage and the second regulated voltage provided by the prior art power amplification device of FIG. 1 as a function of a phase angle when a load Voltage Wave Standing Ratio (VWSR) is held constant. The graph illustrates the prior art power amplification device's decreased ability to provide output power and indicates increased current consumption by the driver amplifier stage when operating into a mismatch.
Figure 3:
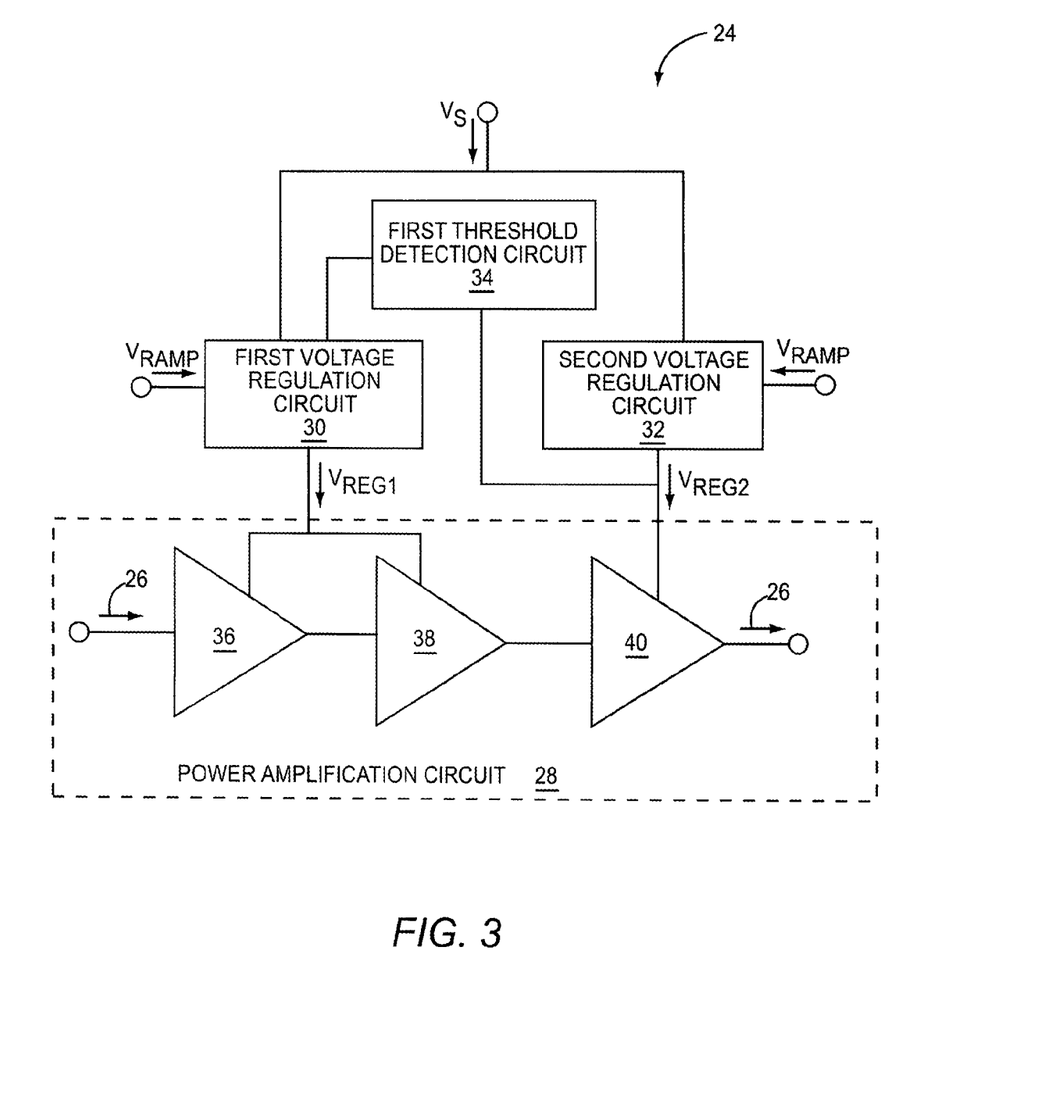
FIG. 3 illustrates one embodiment of a power amplification circuit in accordance with this disclosure. The power amplification circuit includes a first voltage regulation circuit that provides a first regulated voltage to a driver amplifier stage and a second voltage regulation circuit that provides a second regulated voltage to a final amplifier stage along with a threshold detection circuit that increases a first voltage adjustment gain of the first voltage regulation circuit when a second regulated voltage level of the second regulated voltage reaches a threshold voltage.

Referring now to FIGS. 1 and 2B, FIG. 2B demonstrates another disadvantage of the prior art power amplification device 10. FIG. 2B is a graph of the regulated voltages $V_{REG1}$ and $V_{REG2}$ versus the phase angle when the load Voltage Wave Standing Ratio (VWSR) is held constant. As shown in FIG. 3, the regulated voltage $V_{REG1}$ varies with the phase angle to maintain a constant output power. Nevertheless, once the regulated voltage $V_{REG2}$ rails there is no more available power. On the other hand, the regulated voltage $V_{REG1}$ remains constant regardless of phase angle thereby indicating an inability of the driver amplifier stage to provide additional output power and increased current consumption by the driver amplifier stage when operating into a mismatch.

Therefore, what needed are power amplification devices with voltage regulation circuits that can better preserve the maximum output power of the power amplification device while providing increased power efficiency and better performance during mismatch conditions.

SUMMARY

Systems and methods are disclosed for amplifying a radio frequency (RF) transmission signal. More specifically, this disclosure describes embodiments of power amplification devices with voltage regulation circuits configured to provide regulate voltages that determine an amplification gain when amplifying an RF signal. In one embodiment, the power amplification device includes a power amplification circuit, a first voltage regulation circuit that generates a first regulated voltage, a second voltage regulation circuit that generates a second regulated voltage, and a threshold detection circuit. An amplification gain of the power amplification circuit is set in accordance with a first regulated voltage level of the first regulated voltage and a second regulated voltage level of the second regulated voltage. On the other hand, the first voltage regulation circuit is configured to adjust the first regulated voltage level of the first regulated voltage in accordance with a voltage adjustment gain.

In one implementation, the threshold detection circuit is configured to increase the voltage adjustment gain when the second regulated voltage level of the second regulated voltage reaches a threshold voltage level. In this manner, excessive currents are not drawn by the power amplification circuit as the second regulated voltage level is being ramped up. Also, the power efficiency of the power amplification circuit is preserved, since the first regulated voltage level of the first regulated voltage is allowed to rail.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

FIG. 3 illustrates one embodiment of a power amplification device 24 for a radio frequency (RF) transmission signal 26. The power amplification device 24 includes a power amplification circuit 28, a first voltage regulation circuit 30, a second voltage regulation circuit 32, and a first threshold detection circuit 34. The power amplification circuit 28 is configured to amplify the RF transmission signal 26. In this embodiment, the power amplification circuit 28 includes a first amplifier stage 36, a second amplifier stage 38, and a third amplifier stage 40. Other embodiments of the power amplification circuit 28 may include any number of amplifier stages greater than one.

Each of the amplifier stages 36, 38, and 40 provide amplification for the RF transmission signal 26 in a cascaded manner. The first amplifier stage 36 has been configured to receive the RF transmission signal 26. The first amplifier stage 36 is operable to amplify the RF transmission signal 26 in accordance with the first amplification gain. Once the RF transmission 26 has been amplified by the first amplifier stage 36, the RF transmission signal 26 is received by the second amplifier stage 38. The second amplifier stage 38 is operable to amplify the RF transmission signal 26 in accordance with a second amplification gain. Once the RF transmission 26 has been amplified by the second amplifier stage 38, the RF transmission signal 26 is received by the third amplifier stage 40. The third amplifier stage 40 is operable to amplify the RF transmission signal 26 in accordance with a third amplification gain. Thus, a total amplification gain of the power amplification circuit 28 can be approximated as equalling the first amplification gain multiplied by the second amplification gain and further multiplied by the third amplification gain. Note that the third amplifier stage 40 in this embodiment is where power levels will be at their highest, since the RF transmission signal 26 has already been amplified in accordance with the first amplification gain and the second amplification gain. After the RF transmission signal 26 has been amplified by the power amplification circuit 28, the RF transmission signal 26 may be output to other devices, if desired.

The third amplifier stage 40 is sometimes referred to as the final amplifier stage because it is the last amplifier stage that provides amplification to the RF transmission signal 26. The first amplifier stage 36 and the third amplifier stage 38 are sometimes referred to as driver amplifier stage. Other embodiments may have only one amplifier stage in the driver amplifier stage, while still other embodiments may have more than two amplifier stages in the driver amplifier stage. The first amplifier stage 36 and the second amplifier stage 38 are coupled to the first voltage regulation circuit 30. The first voltage regulation circuit 30 is operable to generate a first regulated voltage $V_{REG1}$ and the first amplifier stage 36 and the second amplifier stage 38 are coupled so that the first amplification gain and the second amplification gain are set in accordance with a first regulated voltage level of the first regulated voltage $V_{REG1}$. On the other hand, the third amplifier stage 40 may be connected to the second voltage regulation circuit 32. The second voltage regulation circuit 32 is operable to generate a second regulated voltage $V_{REG2}$. The third amplifier stage 40 is coupled so that the third amplification gain is set in accordance with a second regulated voltage level of the second regulated voltage $V_{REG2}$. The first amplification gain and the second amplification gain can thus be controlled by controlling the first regulated voltage level of the first regulated voltage $V_{REG1}$. Similarly, the third amplification gain can be controlled by controlling the second regulated voltage level of the second regulated voltage $V_{REG2}$.

To control the first regulated voltage level of the first regulated voltage $V_{REG1}$ and the second regulated voltage level of the second regulated voltage $V_{REG2}$, both the first voltage regulation circuit 30 and the second regulated voltage circuit 32 receive a voltage control signal, which in this example is the voltage $V_{RAMP}$. As a voltage control signal level of the voltage control signal $V_{RAMP}$ changes so does the first regulated voltage level of the first regulated voltage $V_{REG1}$ and the second regulated voltage level of the second regulated voltage $V_{REG2}$. The first voltage regulation circuit 30 has a first voltage adjustment gain, which determines the amount of change in the first regulated voltage level as a result of a change in the voltage control signal level of the voltage control signal $V_{RAMP}$. On the other hand, the second voltage regulation circuit 32 has a second voltage adjustment gain. The second voltage adjustment gain determines the amount of change in the second regulated voltage level as a result of a change in the voltage control signal level. In this manner, the first regulated level of the first regulated voltage $V_{REG1}$ is adjusted in accordance with the voltage control signal level of the voltage control signal $V_{RAMP}$ and the first voltage adjustment gain. Similarly, the second regulated voltage level of the second regulated voltage $V_{REG2}$ is adjusted in accordance with the voltage control signal level of the voltage control signal $V_{RAMP}$ and the second voltage adjustment gain. The first voltage regulation circuit 30 and the second regulation voltage circuit 32 thus allow for the first regulated voltage level of the first regulated voltage $V_{REG1}$ and the second regulated voltage level of the second regulated voltage $V_{REG2}$ to be adjusted by different amounts depending on the value of the first voltage adjustment gain and the value of the second voltage adjustment gain.

As shown in FIG. 3, the first threshold detection circuit 34 may be coupled to the first voltage regulation circuit 30 and the second voltage regulation circuit 32. The first threshold detection circuit 34 may detect when the second regulated voltage level of the second regulated voltage $V_{REG2}$ reaches a first threshold voltage level. In response, the first threshold detection circuit 34 increases the first voltage adjustment gain of the first voltage regulation circuit 30. This circuit configuration allows for the first voltage adjustment gain of the first voltage regulation circuit 30 to be boosted once the second regulated voltage level of the second regulated voltage $V_{REG2}$ has settled or is about to settle at a maximum voltage level. In this manner, the first regulated voltage level can be boosted without having to draw and excessive amount of current.

Thus, the output power of the driver amplifier stage does not have to be larger than needed while increasing the power efficiency of the power amplification device 24 since the first regulated voltage level may be allowed to settle at a higher maximum value. Referring again to FIG. 1, the first regulation circuit 30 and the second voltage regulation circuit 32 are configured to receive a supply voltage $V_S$. The first voltage regulation circuit 30 is operable to generate the first regulated voltage $V_{REG1}$ from the supply voltage $V_S$, while the second voltage regulation circuit 32 is operable to generate the second regulated voltage from the supply voltage $V_S$. The supply voltage $V_S$ may be provided from a power source such as a battery, AC-to-DC converter, and/or the like. Generally, the closer the first voltage regulation 30 and the second voltage regulation 32 can bring the first regulated voltage level and the second regulated voltage level to a supply voltage level of the supply voltage $V_S$, the better the power efficiency of the power amplification device 24. While in certain applications, such as when the RF transmission signal is a TDMA transmission signal, the power amplification circuit 28 may be driven into saturation by the first regulated voltage level and the second regulated voltage level, the first regulated voltage level and the second regulated voltage level should not, at least under normal conditions, drive the first voltage regulated circuit 30 or the second voltage regulation circuit 32 into saturation. The saturation voltage level of the first voltage regulation circuit 30 and the second voltage regulation circuit 32 are typically near the supply voltage level of the supply voltage $V_S$. The first regulated voltage level and the second regulated voltage level may be driven precisely to or near the saturation voltage levels without driving the first and second voltage regulation circuits 30, 32 into saturations. The first regulation voltage level and the second regulated voltage level are regulated voltages because the first voltage regulation circuit 30 and the second voltage regulation circuit 32 can maintain the regulated voltage levels despite fluctuations in the supply level of the supply voltage. However, the first voltage regulation circuit 30 and the second voltage regulation 32 cannot appropriately regulate the first and second regulated voltages $V_{REG1}$, $V_{REG2}$ if the circuits are driven into saturation which may result in spectral splatter. Nevertheless, the power amplification device 24 can be configured to boost the first voltage adjustment gain of the first voltage regulation circuit 30 without driving the first voltage regulation circuit 30 and the second voltage regulation circuit 32, at least under normal conditions.

Figure 4:
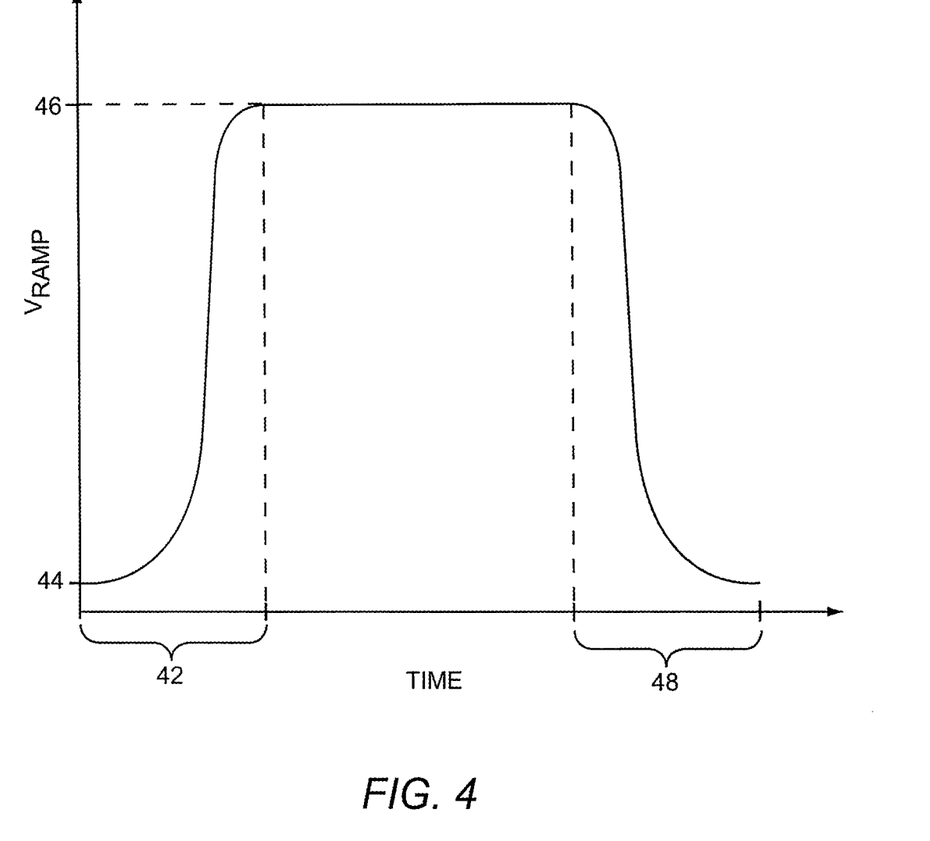
FIG. 4 illustrates one embodiment of a voltage control signal that may be received by the first voltage regulation circuit and the second voltage regulation circuit illustrated in FIG. 3 as a function of time.

FIG. 4 is a graph of one embodiment of the first regulated voltage $V_{REG1}$ and the second regulated $V_{REG2}$ as a function of the voltage control signal level of the voltage control signal $V_{RAMP}$. The voltage control signal $V_{RAMP}$ shown in FIG. 4 is a ramping voltage configured so that the RF transmission signal 26 is amplified by the power amplification circuit 28 to comply with a burst mask. In one embodiment, the RF transmission signal 26 may be a TDMA transmission signal, such as a GSM transmission signal or a PCD transmission signal. In other embodiments, the RF transmission signal 26 may be a Quadrature Amplitude Modulation (QAM) transmission signal, such as an EDGE transmission signal or a DCS transmission signal. The voltage control signal $V_{RAMP}$ may be ramped up during a ramp-up period 42 such that the voltage control signal level of the voltage control signal $V_{RAMP}$ is increased from a minimum voltage control signal level 44 to a maximum voltage control signal level 46. Once the maximum voltage control signal level 46 is reached, the voltage control signal $V_{RAMP}$ may maintain the envelope of the RF transmission signal 28 relatively constant until reaching a ramp-down period 48. During the ramp-down period 48, the voltage control signal $V_{RAMP}$ is received such that the voltage control signal level of the voltage control signal $V_{RAMP}$ is decreased from the maximum control signal level 46 to the minimum control signal level 44.

Figure 5:
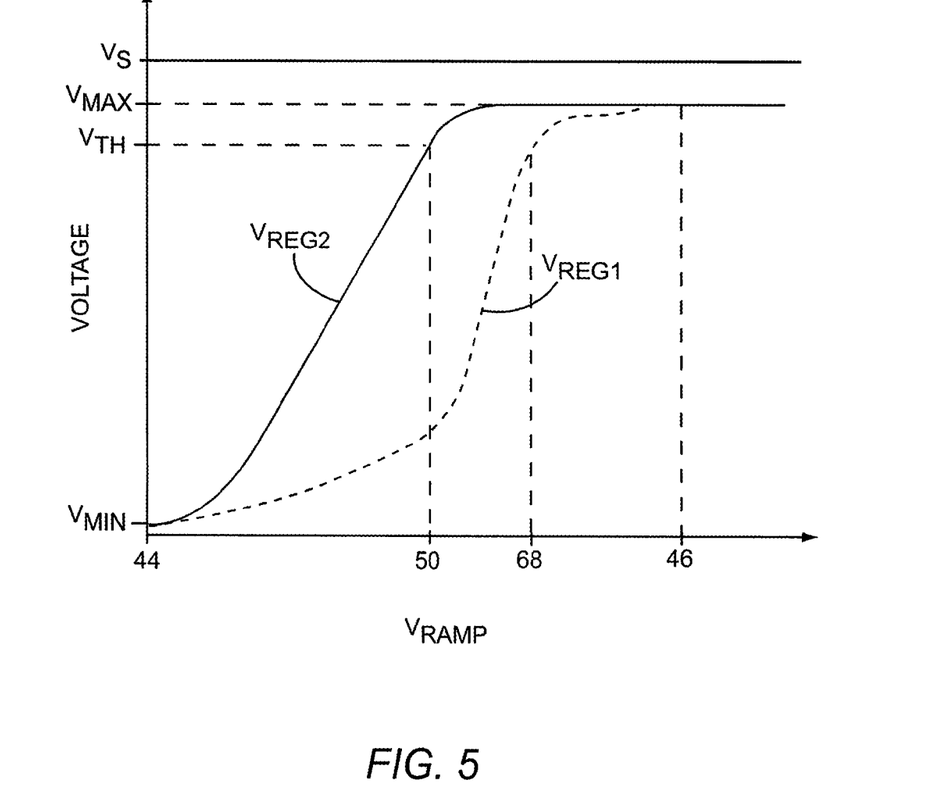
FIG. 5 illustrates one embodiment of the first regulated voltage provided by the first voltage regulation circuit and the second regulated voltage provided by the second voltage regulation circuit of FIG. 3 as a function of the voltage control signal. In this embodiment, the first regulated voltage is allowed to rail thereby preserving the maximum output power while providing increased power efficiency performance.

Referring now to FIGS. 3 and 5, FIG. 5 illustrates one embodiment of the first regulated voltage $V_{REG1}$ and the second regulated voltage $V_{REG2}$ as a function of the voltage control signal $V_{RAMP}$. The minimum voltage control signal level 44 and the maximum voltage control signal level 46 described above with respect to FIG. 4 are shown in FIG. 5. The rate at which the second regulated voltage level of the second regulated voltage $V_{REG2}$ increases and decreases with respect to the voltage control signal $V_{RAMP}$ is determined by the second voltage adjustment gain of the second voltage regulation circuit 32. Similarly, the rate at which the first regulated voltage level of the first regulated voltage $V_{REG1}$ increases and decreases with respect to the voltage control signal $V_{RAMP}$ is determined by the first voltage adjustment gain of the first voltage regulation circuit 30. In this embodiment, the first regulated voltage level of the first regulated voltage $V_{REG1}$ and the second regulated voltage level of the second regulated voltage $V_{REG2}$ increases and decreases between the maximum regulated voltage level $V_{MAX}$ and the minimum regulated voltage level $V_{MIN}$.

The supply voltage level of the supply voltage $V_S$ is also shown in FIG. 5 while the first threshold voltage level is represented by the voltage level $V_{TH}$. The first voltage threshold level $V_{TH}$ is near the maximum regulated voltage level $V_{MAX}$. During the ramp-up period 42 (shown in FIG. 4), when the second regulated voltage level of the second regulated voltage reaches the first threshold voltage level $V_{TH}$, the second regulated level of the second regulated voltage $V_{REG2}$ is about to settle at the maximum regulated voltage level $V_{MAX}$. The first threshold detection circuit 34 is configured to increase the first voltage adjustment gain of the first voltage regulation circuit. This allows the first regulated voltage level of the first regulated voltage $V_{REG1}$ to reach the maximum regulated voltage level $V_{MAX}$.

Since the maximum regulated voltage level $V_{MAX}$ is near the supply voltage level of the supply voltage $V_S$, both the first regulated voltage $V_{REG1}$ and the second regulated voltage $V_{REG2}$ are allowed to rail near the supply voltage level of the supply voltage $V_S$ and may thereby preserve, or at least significantly preserve, the maximum output power of the power amplification device 24. The first threshold detection circuit 34 is configured such that the first voltage adjustment gain is lower than the second voltage adjustment gain when the second regulated voltage level of the second regulated voltage $V_{REG2}$ has not reached the first threshold voltage level. Thus, the second regulated voltage $V_{REG2}$ is allowed to settle at the maximum regulated voltage level $V_{MAX}$ first. However, once the first voltage adjustment gain is increased, the first voltage adjustment gain is higher than the second voltage adjustment gain thereby also allowing the first regulated voltage $V_{REG1}$ to settle at the maximum regulated voltage level $V_{MAX}$ before the voltage control signal level of the voltage control signal $V_{RAMP}$ reaches the maximum voltage control signal level 46 of the voltage control signal $V_{RAMP}$.

During the ramp-down period 48 (shown in FIG. 4), the first voltage adjustment gain allows the first regulated voltage $V_{REG1}$ to decrease faster as the voltage control signal level of the voltage control signal $V_{RAMP}$ decreases. Once the second regulated voltage level is below the first threshold voltage level $V_{TH}$, the threshold detection circuit 34 reduces the first voltage adjustment gain of the first voltage regulation circuit 30. The first voltage adjustment gain is now less than the second regulated voltage adjustment gain of the second voltage regulation circuit 32 and thus the rate of decrease of the second regulated voltage level of the second regulated voltage $V_{REG2}$ is faster than the rate of decrease of the first regulated voltage level of the first regulated voltage $V_{REG1}$ as both of the regulated voltage levels $V_{REG1}$, $V_{REG2}$ approach the minimum regulated voltage level $V_{MIN}$. Note that during both the ramp-up period 42 and the ramp-down period 48, the second regulated voltage level of the second regulated voltage $V_{REG2}$ is at the threshold voltage level $V_{TH}$ when the voltage control signal level of the voltage control signal $V_{RAMP}$ is at the voltage level 50. This voltage level 50 of the voltage control signal $V_{RAMP}$ may be selected in accordance with the characteristics and capabilities of the first voltage regulation circuit 30 and the second voltage regulation circuit 32. By boosting the first voltage adjustment gain of the first voltage regulation circuit 30, the driver amplifier stage (i.e., power amplifier stage 36 and power amplifier stage 38 in the embodiment illustrated in FIG. 3) additional drive power is available to the final amplifier stage (i.e., third amplifier stage 40 in the embodiment illustrated in FIG. 3). However, the configuration of the power amplification device 24 shown in FIG. 3 does not come at the cost to current consumption in other phase angles.

Figure 6:
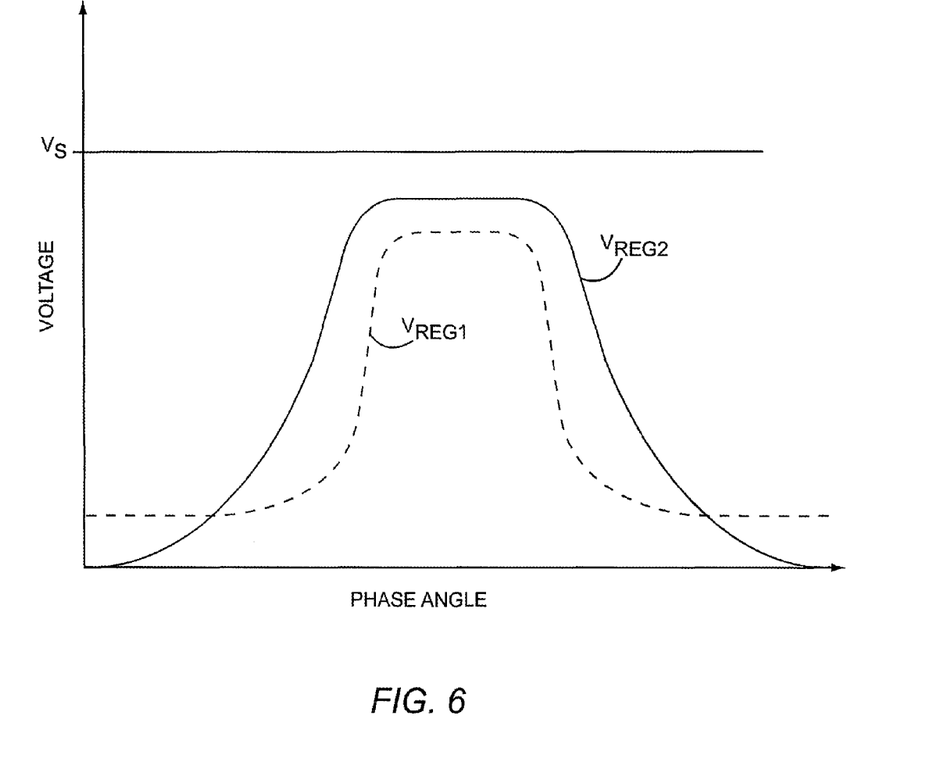
FIG. 6 illustrates one embodiment of the first regulated voltage provided by the first voltage regulation circuit and the second regulated voltage provided by the second voltage regulation circuit of FIG. 3. The graph illustrates that the power amplification device shown in FIG. 3 preserves the maximum output power and an ability to operate into a mismatch.

Referring now to FIGS. 3 and 6, FIG. 6 illustrates a graph of one embodiment of the first regulated voltage $V_{REG1}$ and the second regulated voltage $V_{REG2}$ as a function of the phase angle when the load VSWR is held constant. As shown in FIG. 6, boosting the first voltage adjustment gain of the first voltage regulation circuit 30 and allowing the first regulated voltage level of the first regulated voltage to be increased near the supply voltage level of the supply voltage $V_S$ allows the driver amplifier stage (i.e., the first amplifier stage 36 and the second amplifier stage 38) to provide additional drive power to the final amplifier stage (i.e., the third amplifier stage 40).

In fact, the power amplification device 24 may provide better current consumption performance than power amplification circuits in which the voltage regulation circuits have the same voltage adjustment gain for both the driver amplifier stage and the final amplifier stage. The table below provides current consumption measurements of the power amplification device 24 and a same voltage adjustment power amplification device. The same voltage adjustment gain power amplification device has a first voltage regulation circuit and a second regulation circuit with the same characteristics as the first voltage regulation circuit 30 and the second voltage regulation circuit 32, except that both the first voltage regulation circuit and the second regulation voltage circuit of the same voltage adjustment power amplification device always have equal voltage adjustment gains. As described above with respect to FIG. 4, the first voltage adjustment gain of the first voltage regulation circuit 30 is less than the second voltage adjustment gain of the second voltage regulation circuit 32 prior to the second regulated voltage level of the second regulated voltage $V_{REG2}$ reaching the first threshold voltage level.

The table below provides current consumption values when the power ratio in dBm is at 32.8 dBm and 29.3 dBm for the same voltage adjustment gain power amplification device (PA1) and for the power amplification device 24 (PA2) shown in FIG. 3.

| Specification | Unit | PA1 | PA2 |
| --- | --- | --- | --- |
| Current consumption at +32.8 dBm | mA | 1406 | 1293 |
| Current consumption at +29.3 dBm | mA | 744 | 651 |

In either case, providing the first voltage adjustment gain lower than the second voltage adjustment gain while the second regulated voltage $V_{REG2}$ is being ramped up provides for less current consumption and thus greater power efficiency. However, as shown by FIG. 6 boosting the first voltage adjustment gain when the second regulated voltage level of the second regulated voltage $V_{REG2}$ reaches the first threshold voltage level provides even more current savings since the maximum output power into a mismatch is not affected (or at least not significantly affected) in other phase angles.

Figure 7:
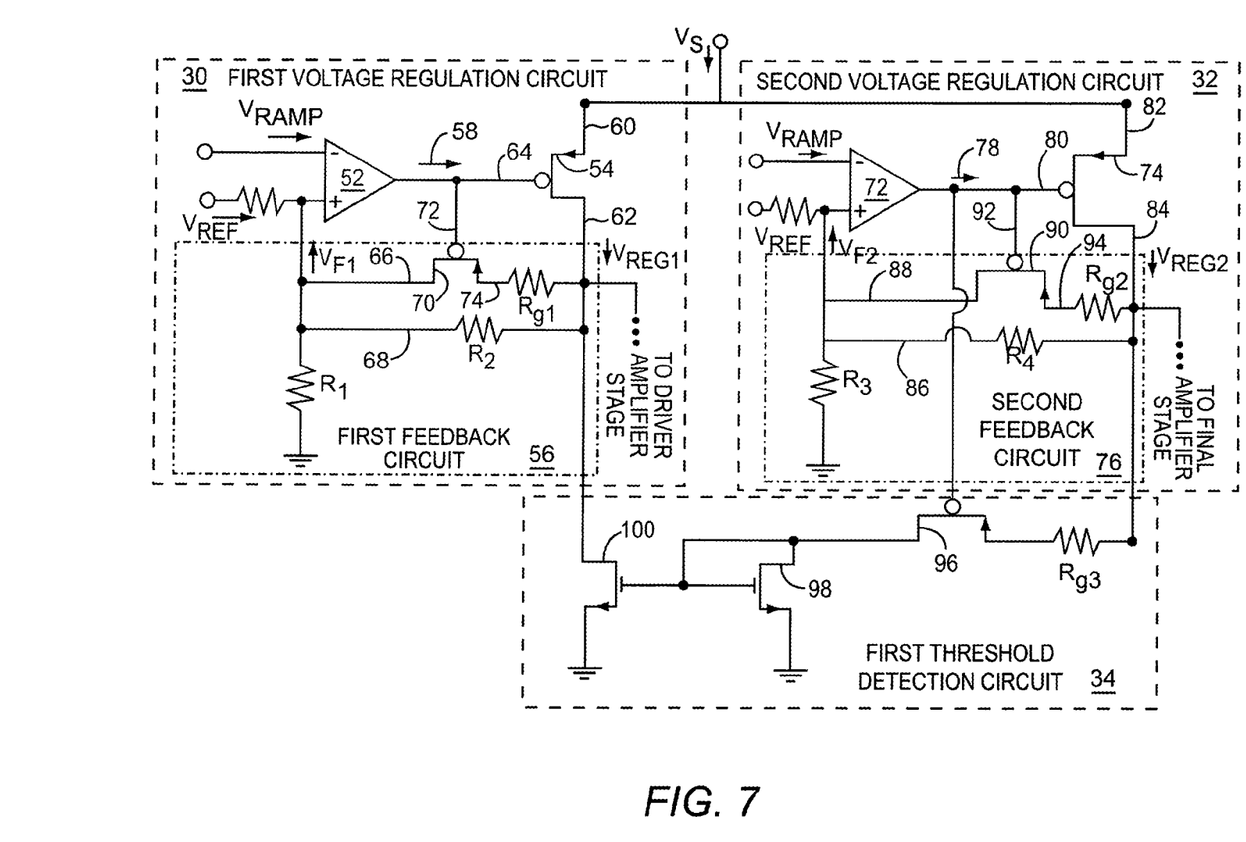
FIG. 7 is a circuit diagram of one implementation of the power amplification device shown in FIG. 3.

Referring now to FIG. 7, FIG. 7 illustrates a circuit diagram of one implementation of the first voltage regulation circuit 30, second voltage regulation circuit 32, and the first threshold detection circuit 34. Both the first voltage regulation circuit 30 and the second regulation circuit 32 are configured to receive the supply voltage $V_S$. The first voltage regulation circuit 30 is operable to generate the first regulated voltage $V_{REG1}$ from the supply voltage $V_S$. The second regulated voltage circuit 32 is operable to generate the second regulated voltage $V_{REG2}$ from the supply voltage $V_S$. As explained above, the first regulated voltage $V_{REG1}$ is provided to the driver amplifier stage while the second regulated voltage $V_{REG2}$ is provided to the final amplifier stage. During a transmission burst, the first voltage regulation circuit 30 and the second voltage regulation circuit 32 receive the voltage control signal $V_{RAMP}$. This voltage control signal $V_{RAMP}$ may be designed so that the first regulated voltage level of the first regulated voltage $V_{REG1}$ and the second regulated voltage level of the second regulated voltage $V_{REG2}$ sets the amplification gain of the driver amplifier stage and the final amplifier stage in order for the RF transmission signal (not shown) to comply with a burst mask specified for a timeslot.

The first voltage regulation circuit 30 has a first differential amplifier 52, a first voltage regulator 54, and a first feedback circuit 56. The differential amplifier 52 is configured to receive the voltage control signal $V_{RAMP}$ and the feedback signal $V_{F1}$ from the first feedback circuit 56. The differential amplifier 52 is operable to generate a first voltage regulator control signal 58 that is received by the first voltage regulator 54. The first regulated voltage level of the first regulated voltage $V_{REG1}$ may be set in accordance with a first voltage regulator signal level of the first voltage regulator control signal 58. The first differential amplifier 52 may be configured to drive a first feedback signal level of the first feedback signal $V_{F1}$ to be approximately equal to the voltage control signal level of the voltage control signal $V_{RAMP}$. When the voltage difference between the voltage control signal level of the voltage control signal $V_{RAMP}$ and the feedback signal level of the feedback signal $V_{F1}$ is zero, the first differential amplifier 52 maintains the first voltage regulator control signal level of the first voltage regulator control signal 58 essentially constant. However, when the voltage difference is not zero, the first differential amplifier generates the first voltage regulator control signal 58 such that the first voltage regulator control signal level adjusts the first regulated voltage level of the first regulated voltage $V_{REG1}$ in accordance with the first voltage adjustment gain of the first voltage regulation circuit 30 and the voltage difference between the voltage control signal level and the feedback signal level.

As shown in FIG. 7, the first voltage regulator 54 is configured to receive the first voltage regulator control signal 58 and generate the first regulated voltage $V_{REG1}$ from the supply voltage $V_S$. The voltage regulator 54 sets the first regulated voltage level of the first regulated voltage $V_{REG1}$ in accordance with the first voltage regulated control signal level of the first voltage regulator control signal 58. The first voltage regulation circuit 30 is configured as a low-drop-out (LDO) voltage regulation circuit. The first voltage regulator 54 is a first field effect transistor (FET) having a first source terminal 60, a first drain terminal 62, and a first gate terminal 64. In this embodiment, the first voltage regulator 54 is a P-type FET and thus the source terminal is coupled to receive the supply voltage $V_S$. While the first drain terminal 62 is configured to output the first regulated voltage $V_{REG1}$. This first regulated voltage $V_{REG1}$ is provided to the driver amplifier stage (not shown). So long as the first voltage regulator 54 is not saturated, the first voltage regulator 54 regulates the regulated voltage level so that variations in the supply voltage level of the supply voltage $V_S$ do not significantly affect the first regulated voltage level. Since the first voltage regulation circuit 30 is configured as a LDO voltage regulation circuit, the drop out voltage level is simply the saturation voltage level of the P-type FET. It should be noted that alternative embodiments, the first voltage regulation circuit 30 may be configured as a different type of regulation circuit such as a standard voltage regulation circuit or a quasi LDO circuit. While not required, the LDO circuit configuration is generally preferable because the LDO circuit configuration tends to have the lowest drop out level and therefore can provide better power efficiency.

The first voltage regulation circuit 30 includes the first feedback circuit 56. The first feedback circuit 56 has a first feedback impedance and the first voltage regulation circuit 30 is configured such that the first voltage adjustment gain is set by the first feedback impedance. As previously discussed, the first differential amplifier 58 may be configured to drive the voltage regulator 54 so that the feedback signal level of the feedback signal $V_{F1}$ is approximately equal to the voltage control signal level of the voltage control signal $V_{RAMP}$. As a result, this causes the first regulated voltage level of the first regulated voltage $V_{REG1}$ to be adjusted. The amount of adjustment of the regulated voltage level of the first regulated voltage $V_{REG1}$ thus depends on the amount of adjustment of the first regulated voltage level required so as to drive the feedback signal level of the first feedback signal $V_{F1}$ approximately equal to the voltage control signal level of the voltage control signal $V_{RAMP}$. Accordingly, the first feedback circuit 56 is coupled as to set the first voltage adjustment gain of the first voltage regulation circuit 30.

To prevent, or at least reduce, the likelihood that the first voltage regulation circuit 30 is driven into saturation, the first feedback circuit 56 reduces the first voltage adjustment gain. To do this, the first feedback circuit has a second threshold detection circuit 66 coupled to switch the feedback impedance to from a first impedance value to a second impedance value when the first regulated voltage level of the first regulated voltage $V_{REG1}$ has reached the first threshold level. With reference back to FIG. 5, this limiting is shown to occur when the voltage control signal $V_{RAMP}$ is at the voltage value 68.

In FIG. 7, the feedback circuit 56 is coupled so that the first voltage adjustment gain of the first voltage regulation circuit 30 is provided in accordance with a feedback impedance of the first feedback circuit 56. The first feedback circuit 56 includes a first feedback path 68 that has a first feedback path impedance. The first feedback path shown in FIG. 7 includes a first resistor $R_1$ and a second resistor $R_2$ configured as a voltage divider. The voltage divider provides the first feedback path 66 with the first feedback path resistance and the first resistor $R_1$ is coupled to receive the first regulated voltage $V_{REG1}$. When the second threshold detection circuit 66 is not enabled the voltage divider provides the feedback impedance for the first voltage regulation circuit 30. The second threshold detection circuit is couple to switch the first feedback impedance from the impedance value provided by the voltage divider to a third impedance value determined by the resistance of the resistor $R_1$, the resistance of resistor $R_2$, and a resistance of the resistor $R_{g1}$. Note that the activation of the second threshold detection circuit 66 is provided by a second P-type FET 70. The second P-type FET may to be relatively large so that there is a small voltage drop across the transistor when activated. To activate the second P-type FET 70 the gate terminal 72 is coupled to receive the first voltage regulator control signal 58 and the source terminal 74 is configured to receive the first regulated voltage $V_{REG1}$. When a voltage difference between the first regulated voltage level of the first regulated voltage $V_{REG1}$ and the first voltage regulator control signal level of the first voltage regulator signal 58 is equal to the first threshold voltage level, the second detection circuit 66 is activated to modify the first feedback impedance of the first feedback circuit 56 and prevent the first voltage regulator 54 from reaching saturation.

The second voltage regulation circuit 32 operates in a manner similar to the first voltage regulation circuit 30 except that the second adjustment gain of the second voltage regulation circuit 32 is different. This is clearly demonstrated in FIG. 5 since the rate at which the second regulated voltage $V_{REG2}$ increases before the voltage control signal level 50 is higher than the rate at which the first regulated voltage $V_{REG1}$ increases. Referring again to FIG. 7, the second voltage regulation circuit 32 also receives the voltage control signal $V_{RAMP}$ and the biasing voltage $V_{REF}$. The voltage regulation circuit 32 also includes a second differential amplifier 72, a second voltage regulator 74, and a second feedback circuit 76. The second differential amplifier 72 generates a second voltage regulator control signal 78 which is provided to a gate terminal 80 of the second voltage regulator 74 which in this example is another P-type FET. The voltage regulator 74 receives the supply voltage $V_S$ at a source terminal 82 and generates the second regulated voltage $V_{REG2}$ at the drain terminal 84. The second voltage regulator 74 thus generates the second regulated $V_{REG2}$ from the supply voltage $V_S$ and sets the second regulated voltage level of the second regulated voltage in accordance with a second voltage regulator control signal level of the second voltage regulator control signal 78. The second feedback circuit 76 operates in a manner similar to the first feedback circuit 56 except that the second feedback circuit 76 provides a different voltage adjustment gain. The voltage divider formed by the resistors $R_3$ and $R_4$ are in a third feedback path 86. As shown in FIG. 5, prior to the second regulated voltage level of the second regulated voltage $V_{REG2}$ reaching the first threshold voltage level, the voltage divider provided by resistors $R_3$ and $R_4$ set the second voltage adjustment gain. However, the second feedback circuit 76 also includes a third threshold detection circuit 88. The third threshold detection circuit 38 has a third P-type FET 90 that activates and deactivates the third threshold detection circuit 88. When a voltage difference between a gate terminal 92 and a source terminal 94 of the third P-type FET 90 reaches the threshold voltage level $V_{TH}$, the third threshold circuit activates and reduces the second voltage adjustment gain to prevent the second voltage regulator 74 from entering saturation. The feedback impedance of the second feedback circuit 76 is now provided by the combination of the resistors $R_3$, $R_4$, and a resistor $R_{g2}$ in the threshold detection circuit 38.

FIG. 7 also illustrates a circuit diagram of one embodiment of the first threshold circuit detection 34. As the second regulated voltage level of the second regulated voltage $V_{REG2}$ approaches the first threshold voltage level, the second voltage regulator control signal level of the second voltage regulator signal 78 approaches zero. When this occurs, a fourth P-type FET 94 is enabled and current flows through a resistor $R_{g3}$ to a N-type FET 98 and ultimately to ground. This current is mirrored in a second N-type FET 100 causing current to be pulled from the first feedback circuit 56. This thereby causes a decrease in the first feedback signal $V_{F1}$ and thereby causes the first feedback signal level of the first feedback signal $V_{F1}$ to be higher in order to get the first feedback signal level and the voltage control signal level of $V_{RAMP}$ approximately equal. In this manner, the first voltage adjustment gain of the first feedback circuit 56 is increased as shown in FIG. 5 at the voltage control signal level 50. With proper matching and scaling of the resistors $R_1$, $R_2$, $R_{g1}$, $R_3$, $R_4$, $R_{g2}$, and $R_{g3}$ along with proper calibration of the second P-type FET 70 and third P-type FET 90 the response of the first voltage regulation circuit 30 and the second voltage regulation circuit 32 is robust and can stand variations in temperature and variations in fabrication while providing a better maximum output power along with increased power efficiency.

It should be noted that the first threshold detection circuit 34 shown in FIG. 7 is simply one example of a threshold detection circuit that can utilized to boost the first voltage adjustment gain. Any other combination of elements can be coupled to pull current from the first feedback circuit 56 and thereby boost the first voltage adjustment gain. This may involve any combination of FETs in series or parallel with an impedance network provided by the first feedback circuit 56. Furthermore, while the first voltage control circuit 30 and the second voltage control circuit 32 in FIG. 7 are arranged as LDO circuits that utilize P-type FETs, any type of suitable voltage regulation circuit may be utilized, such as standard voltage regulation circuits or quasi LDO voltage regulation circuits. Generally, LDO circuits provide the lowest drop out voltage level and thus can provide better power efficiency, however, other types of configurations may be utilized depending on the type of application and desired electrical characteristics. Finally, while the first feedback circuit 56 and the feedback circuit 76 utilize a voltage divider configuration in order to provide the respected feedback impedance of the first feedback circuit 56 and the second feedback circuit 76, any type of suitable impedance network may be utilized depending on the desired characteristics of the first voltage adjustment gain and the second voltage adjustment gain. Similarly, the second threshold detection circuit 66 and the third threshold detection circuit 88 that are utilized to lower the first voltage adjustment gain and the second voltage adjustment gain may have a different configuration to detect the first threshold voltage level.

Figure 8:
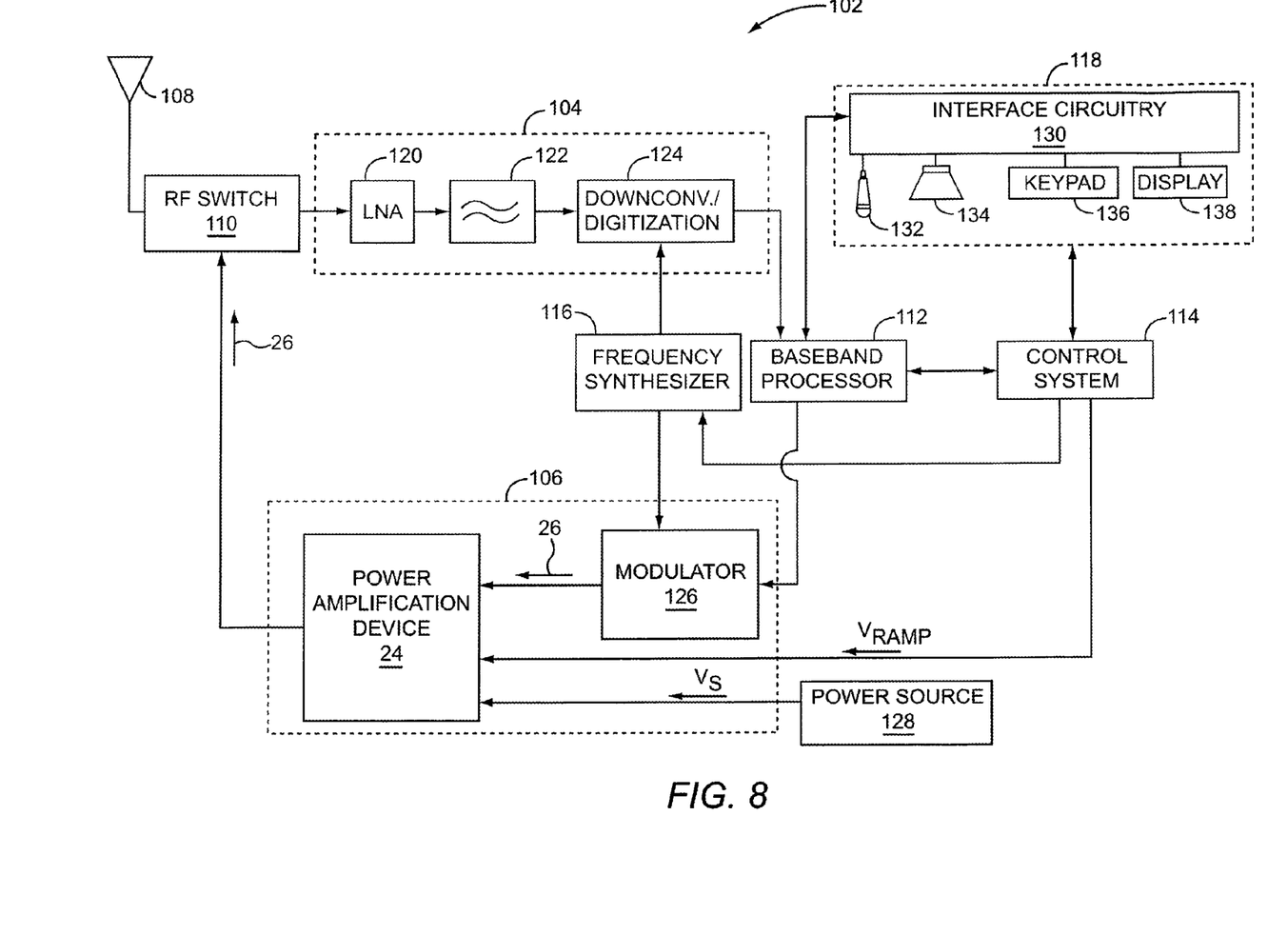
FIG. 8 illustrates one embodiment of a mobile communication device where the power amplification device shown in FIG. 3 has been incorporated to provide power amplification to an RF transmission signal.

With reference to FIG. 8, an embodiment of the power amplification device 24 may be incorporated in a mobile communication device 102, such as a mobile cellular phone, personal digital assistant (PDA), and/or the like. The basic architecture of the mobile communication device 102 may include a receiver front end 104, a RF transmitter section 106, an antenna 108, a duplexer or RF switch 110, a baseband processor 112, a control system 114, a frequency synthesizer 116, and an interface 118. The receiver front 104 receives information bearing RF receiver signals from one or more remote transmitters provided by a base station. A low noise amplifier (LNA) 120 amplifies the RF receive signal. A filter circuit 122 minimizes broadband interference in the RF receive signal, while a down converter 124 down converts the filtered RF receive signal to an intermediate or baseband frequency signal, which is digitized to one or more digital streams. The receiver front end 104 typically uses one or more mixing frequencies generated by the frequency synthesizer 116.

The baseband processor 112 processes the digitized RF receive signal to extract the information or data that is conveyed in the RF receive signal. This processing typically comprises demodulation, decoding, and error corrections operations. As such, the baseband processor 112 is generally implemented in one or more digital signal processors (DSPs).

On the transmit side, the baseband processor 112 receives digitized data from the control system 114, which it encodes for transmission. The encoded data is output to the RF transmitter section 106, where it is used by a modulator 126 to modulate a carrier signal at a desired transmit frequency and thereby generate the RF transmission signal 26 prior to amplification. The power amplification device 24 amplifies the RF transmission signal 26 to a signal level appropriate for transmission from the antenna 108. Specifically, the power amplification device 24 receives and amplifies the RF transmission signal 26 from the modulator 126 to provide the RF transmission signal 26 after amplification to the antenna 108.

As described in detail above, the power amplification device 24 provides the amplification for the RF transmission signal 26 under the control of the voltage control signal $V_{RAMP}$, which has been generated by the control system 114. The supply voltage $V_S$ is received from a power source 128 such as a battery, an AC-to-DC converter, and/or the like.

A user may interact with the mobile communication device 102 via the interface 118, which may include interface circuitry 130 associated with a microphone 132, a speaker 134, a keypad 136, and a display 138. Alternatively or additionally, the mobile communications device 102 may include a touch screen for interface with the user. The interface circuitry 130 typically includes analog-to-digital converters, digital-to-analog converters, amplifiers, and/or the like. Additionally, it may include a voice encoder/decoder, which may communicate directly with the baseband processor 112.

The microphone 132 will typically convert audio input, such as a user's voice, into an electrical signal which is digitized and passed directly or indirectly to the baseband processor 112. Audio information encoded in the receive signal is recovered by the baseband processor 112 and is converted into an analog suitable for driving the speaker 134. The keypad 136 and the display 138 enable the user to interact with the mobile communications device 102 by inputting numbers to be dialed, retrieving address book information, monitoring call progress information, and/or the like.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) power amplification device for an RF transmission signal comprising:
   a first voltage regulation circuit operable to generate a first regulated voltage and to adjust a first regulated voltage level of the first regulated voltage in accordance with a voltage adjustment gain;
   a second voltage regulation circuit operable to generate a second regulated voltage;
   a first threshold detection circuit configured to increase the voltage adjustment gain when a second regulated voltage level of the second regulated voltage reaches a threshold voltage level; and
   a power amplification circuit configured to amplify the RF transmission signal in accordance with an amplification gain, and to adjust the amplification gain in accordance to the first regulated voltage level and the second regulated voltage level.

2. The RF power amplification device of claim 1 wherein the first voltage regulation circuit is configured to receive a supply voltage and the first voltage regulation circuit is operable to generate the first regulated voltage from the supply voltage.

3. The RF power amplification device of claim 1 wherein the second voltage regulation circuit is configured to receive a supply voltage and the second voltage regulation circuit is operable to generate the second regulated voltage from the supply voltage.

4. The RF power amplification device of claim 1 wherein:
   the first voltage regulation circuit is configured to receive a supply voltage and the first voltage regulation circuit is operable to generate the first regulated voltage from the supply voltage; and
   the second voltage regulation circuit is configured to receive the supply voltage and the second voltage regulation circuit is operable to generate the second regulated voltage from the supply voltage.

5. The RF power amplification device of claim 1 wherein the first voltage regulation circuit further comprises a first feedback circuit having a first feedback impedance and the first voltage regulation circuit is configured such that the voltage adjustment gain is set by the first feedback impedance when the second regulated voltage level of the second regulated voltage has not reached the threshold voltage level.

6. The RF power amplification device of claim 5 wherein the first threshold detection circuit is coupled to the first feedback circuit to switch the first feedback impedance from a first impedance value to a second impedance value when the second regulated voltage level of the second regulated voltage has reached the threshold voltage level.

7. The RF power amplification device of claim 6 wherein the second voltage regulation circuit further comprises a second feedback circuit having a second feedback impedance and wherein:
   the second voltage regulation circuit is configured such that the voltage adjustment gain is set by the second feedback impedance having a third impedance value.

8. The RF power amplification device of claim 7 wherein:
   the second feedback circuit further comprises a second threshold detection circuit coupled to switch the second feedback impedance from the third impedance value to a fourth impedance value when the second regulated voltage level of the second regulated voltage has reached the threshold voltage level.

9. The RF power amplification device of claim 8, wherein the first feedback circuit further comprises a third threshold detection circuit coupled to switch the first feedback impedance from the second impedance value to a fifth impedance value when the first regulated voltage level of the first regulated voltage has reached the threshold voltage level.

10. The RF power amplification device of claim 6 wherein:
    the first voltage regulation circuit is operable to receive a voltage control signal and to generate the first regulated voltage from a supply voltage such that the first regulated voltage level of the first regulated voltage is adjusted in accordance with a voltage control signal level of the voltage control signal and the voltage adjustment gain.

11. The RF power amplification device of claim 6 wherein:
    the first feedback circuit further comprises a second threshold detection circuit coupled to switch the first feedback impedance from the second impedance value to a third impedance value when the first regulated voltage level of the first regulated voltage has reached the threshold voltage level.

12. The RF power amplification device of claim 1 wherein the amplification gain is a total amplification gain based on a first amplification gain and a second amplification gain of the power amplification circuit, and wherein the power amplification circuit further comprises:

a first amplifier stage operable to amplify the RF transmission signal in accordance with the first amplification gain and coupled so that the first amplification gain is set in accordance with the first regulated voltage level of the first regulated voltage; and a second amplifier stage operable to amplify the RF transmission signal in accordance with the second amplification gain and coupled so that the second amplification gain is set in accordance with the second regulated voltage level of the second regulated voltage.

13. The RF power amplification device of claim 12 further comprising a third amplifier stage operable to amplify the RF transmission signal in accordance with a third amplification gain and coupled so that the third amplification gain is set in accordance with the first regulated voltage level of the first regulated voltage and wherein the total amplification gain is further based on the third amplification gain.

14. The RF power amplification device of claim 13 wherein:

the first amplifier stage is configured to receive the RF transmission signal before amplification;

the third amplifier stage is coupled to receive the RF transmission signal after amplification by the first amplifier stage; and the second amplifier stage is coupled to receive the RF transmission signal after amplification by the third amplifier stage.

15. The RF power amplification device of claim 1 wherein the second voltage regulation circuit comprises:

a first voltage regulator having a first voltage regulator terminal configured to receive a supply voltage, a second voltage regulator terminal configured to output the second regulated voltage, and a first voltage regulator control terminal configured to receive a first voltage regulator control signal having a first voltage regulator control signal level, wherein as long as the second regulated voltage level of the second regulated voltage is below a first saturation voltage level of the first voltage regulator, the first voltage regulator is operable to generate the second regulated voltage such that the second regulated voltage level is set in accordance with the first voltage regulator control signal level of the first voltage regulator control signal.

16. The RF power amplification device of claim 15 wherein the first threshold detection circuit comprises a first field effect transistor (FET) that includes a first drain terminal, a first source terminal, and a first gate terminal and wherein:

the first gate terminal of the first FET is coupled to receive the first voltage regulator control signal; and the first source terminal and the first drain terminal are coupled so that the first FET is switched on when the second regulated voltage level reaches the threshold voltage level.

17. The RF power amplification device of claim 16 wherein the first voltage regulation circuit further comprises a first feedback circuit having a first feedback impedance and the first threshold detection circuit further comprises a current mirror, and wherein:

the first voltage regulation circuit is configured such that the voltage adjustment gain is set by the first feedback impedance;

the current mirror is coupled to the first FET so that the current mirror is deactivated when the first FET is switched off and the current mirror is activated when the first FET is switched on; and the first feedback circuit is coupled to the current mirror so that the first feedback impedance has a first impedance value when the current mirror is deactivated and the first feedback impedance has a second impedance value when the current mirror is activated.

18. A method of amplifying a radio frequency (RF) transmission signal comprising:

during a ramp-up period, generating a first regulated voltage having a first regulated voltage level;

during the ramp-up period, adjusting the first regulated voltage level of the first regulated voltage in accordance with a voltage adjustment gain;

during the ramp-up period, generating a second regulated voltage having a second regulated voltage level;

while generating both the first regulated voltage and the second regulated voltage during the ramp-up period, setting an amplification gain in accordance with the first regulated voltage level of the first regulated voltage and the second regulated voltage level of the second regulated voltage;

while generating both the first regulated voltage and the second regulated voltage during the ramp-up period, amplifying the RF transmission signal in accordance with the amplification gain; and while amplifying the RF transmission signal during the ramp-up period, increasing the voltage adjustment gain in response to detecting that the second regulated voltage level has reached a threshold voltage level.

19. The method of claim 18 further comprising:

during a ramp-down period, generating the first regulated voltage having the first regulated voltage level;

during the ramp-down period, adjusting the first regulated voltage level of the first regulated voltage in accordance with the voltage adjustment gain;

during the ramp-down period, generating the second regulated voltage having the second regulated voltage level;

while generating both the first regulated voltage and the second regulated voltage during the ramp-down period, setting the amplification gain in accordance with the first regulated voltage level of the first regulated voltage and the second regulated voltage level of the second regulated voltage; and while amplifying the RF transmission signal during the ramp-down period, reducing the voltage adjustment gain in response to detecting that the second regulated voltage level is below the threshold voltage level.

20. The method of claim 18 wherein increasing the voltage adjustment gain in response to detecting that the second regulated voltage level has reached the threshold voltage level comprises adjusting an impedance from a first impedance value to a second impedance value.

* * * * *